(12) United States Patent
Starr et al.

(10) Patent No.: US 6,586,966 B1
(45) Date of Patent: Jul. 1, 2003

(54) DATA LATCH WITH LOW-POWER BYPASS MODE

(75) Inventors: Gregory Starr, San Jose, CA (US);
Martin Langhammer, Poole (GB);
Chiao Kai Hwang, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/952,223

(22) Filed: Sep. 13, 2001

(51) Int. Cl.[7] ............................................. H03K 19/177
(52) U.S. Cl. ............................ 326/40; 326/41; 326/37
(58) Field of Search ............................. 326/37, 39, 40, 326/41, 47

(56) References Cited

U.S. PATENT DOCUMENTS

| | | | |
|---|---|---|---|
| 3,473,160 A | 10/1969 | Wahlstrom | 340/172.5 |
| 5,122,685 A | 6/1992 | Chan et al. | 307/465.1 |
| RE34,363 E | 8/1993 | Freeman | 307/465 |
| 5,483,178 A | 1/1996 | Costello et al. | 326/41 |
| 5,689,195 A | 11/1997 | Cliff et al. | 326/41 |
| 5,969,539 A * | 10/1999 | Veytsman et al. | 326/39 |
| 6,034,541 A * | 3/2000 | Kopec, Jr. et al. | 326/39 |
| 6,157,210 A * | 12/2000 | Zaveri et al. | 326/40 |
| 6,215,326 B1 | 4/2001 | Jefferson et al. | 326/41 |
| 6,294,925 B1 * | 9/2001 | Chan et al. | 326/37 |

FOREIGN PATENT DOCUMENTS

| | | |
|---|---|---|
| EP | 0 167 047 | 1/1986 |
| WO | WO95/16993 | 6/1995 |

* cited by examiner

Primary Examiner—Michael Tokar
Assistant Examiner—Anh Tran
(74) Attorney, Agent, or Firm—Fish & Neave; Jeffrey H. Ingerman (57) ABSTRACT

A bypassable latch circuit consumes less power in the bypass mode than it does in the latched mode. The circuit includes a flip-flop whose output is routed to an input of a multiplexer. The other input of the multiplexer is the input of the flip-flop as well. The multiplexer is used to select as the latch output either the registered or latched flip-flop output, or the flip-flop input. The flip-flop is modified by replacing the inverter at the flip-flop clock input with a logic gate that accepts as inputs both the clock input and a control input. The control input can cause the flip-flop to ignore the clock, preventing switching that consumes power by charging and discharging capacitive elements in the flip-flop.

53 Claims, 9 Drawing Sheets

DATA LATCH WITH LOW-POWER BYPASS MODE

BACKGROUND OF THE INVENTION

This invention relates to a flip-flop for use in applications in which the flip-flop may be optionally bypassed—e.g., as an output latch for programmable logic circuitry whose output may be registered or unregistered. More particularly, this invention relates to such a flip-flop having a low-power mode for use when bypassed.

A flip-flop circuit is a well known and simple circuit for holding the value of an input for at least one clock cycle in a clocked system. For this reason, flip-flops frequently are used as output latches or registers in programmable logic devices. In such an application, the output of a programmable logic element typically is routed to the flip-flop, where it may be made available at the next clock edge, for one full clock cycle, for use by additional logic or as an output of the programmable logic device. It is also typical to provide a bypass route for the output of the programmable logic element, allowing it to be routed asynchronously to additional logic or to a device output.

A common configuration for an output bypass as just described is to route the programmable logic element output both to the input of the flip-flop and to an input of an output multiplexer. The output of the flip-flop also is routed to an input of the output multiplexer, and the multiplexer can be controlled to select either the direct, unregistered logic output or the registered output of the flip-flop. When this configuration is used, the flip-flop, which also is connected to the system clock, continues to switch at every clock cycle, even when the output multiplexer selects the unregistered bypass output. In addition, if the input data vary, that may also cause switching of components within the flip-flop. As a result, the flip-flop consumes power even though it is not being used.

In view of the foregoing it would be desirable to be able to provide a latch circuit that consumes less power in the bypass mode than it does in the latched mode.

SUMMARY OF THE INVENTION

It is an object of the present invention to provide a latch circuit that consumes less power in the bypass mode than it does in the latched mode. This and other objects of the invention are accomplished in accordance with the principles of one aspect of the invention by providing, for example as part of a programmable logic device, a latch circuit that includes a flip-flop that can effectively be turned off if it is bypassed.

In particular, there is provided, in accordance with the present invention, a latch circuit including a flip-flop having a data input, a data output, and a clock input, and a multiplexer including a first input connected to the data input of the flip-flop and a second input connected to the data output of the flip-flop. The latch circuit also has a latch output and a control input for selecting one of the first and second inputs as the latch output. The flip-flop circuit also has a low-power selection input connected to the control input of the multiplexer. When the control input selects the first input as the latch output, the low-power selection input causes the flip-flop to enter a low-power mode.

BRIEF DESCRIPTION OF THE DRAWINGS

The above and other objects and advantages of the invention will be more apparent upon consideration of the following detailed description, taken in conjunction with the accompanying drawings, in which like reference characters refer to like parts throughout, and in which.

DETAILED DESCRIPTION OF THE INVENTION

The present invention overcomes the aforementioned disadvantage of previously known latch circuits with a bypass option—viz., that a bypassed flip-flop would continue to draw power. The disadvantage can be seen by reference to FIGS. 1–3, which show an embodiment 10 of a previously known latch circuit of the type described above.

Figure 1:
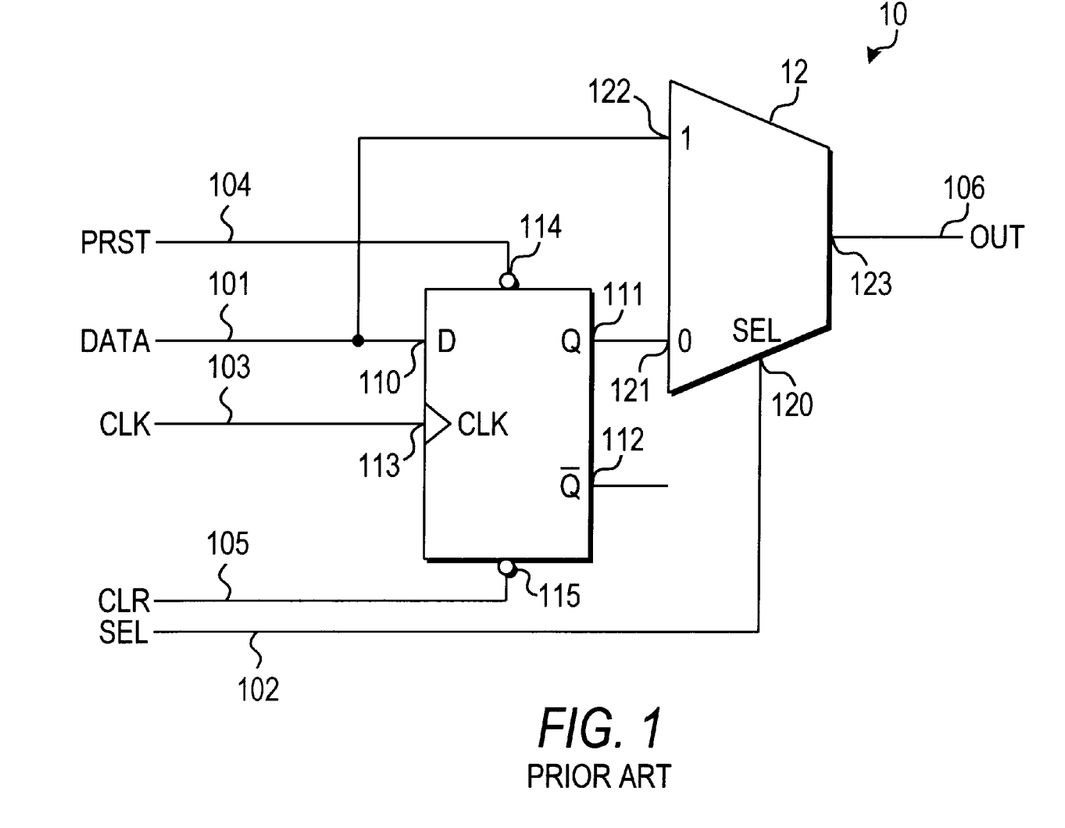
FIG. 1 is schematic diagram of a previously known latch circuit of the type of which the present invention is a improvement.

Latch circuit 10 includes a D-type flip-flop 11 and a multiplexer 12. Flip-flop 11 has an input terminal 110, an output terminal 111, an inverted output terminal 112 (not used), a clock input 113, a preset input 114 and a clear input 115. Multiplexer 12 has a first input terminal 121, a second input terminal 122, an output terminal 123, and a control input terminal 120.

Latch data input 101 is connected to both flip-flop data input terminal 110 and second multiplexer input terminal 122. Latch bypass control input 102 is connected to multiplexer control input terminal 120. Flip-flop output terminal 111 is connected to first multiplexer input terminal 121. Latch clock input 103 is connected to flip-flop clock input 113. Latch preset and clear inputs 104, 105 are connected to flip-flop preset and clear inputs 114, 115; these operate as standard preset and clear inputs for flip-flop 11. Multiplexer output terminal 123 is connected to latch output terminal 106.

When control input 102/120 is set to select first multiplexer input terminal 121, latch 10 operates in its standard registered mode. In that mode, data arriving on latch data input 101—e.g., from a programmable logic element—is provided as a registered output on output terminal 106/123 in accordance with clock signal 103. When control input 102/120 is set to select second multiplexer input terminal 122, latch 10 operates in its asynchronous, bypass mode. In that mode, data arriving on latch data input 101—e.g., from a programmable logic element—is provided substantially immediately as an output on output terminal 106/123, asynchronously of clock signal 103.

Figure 2:
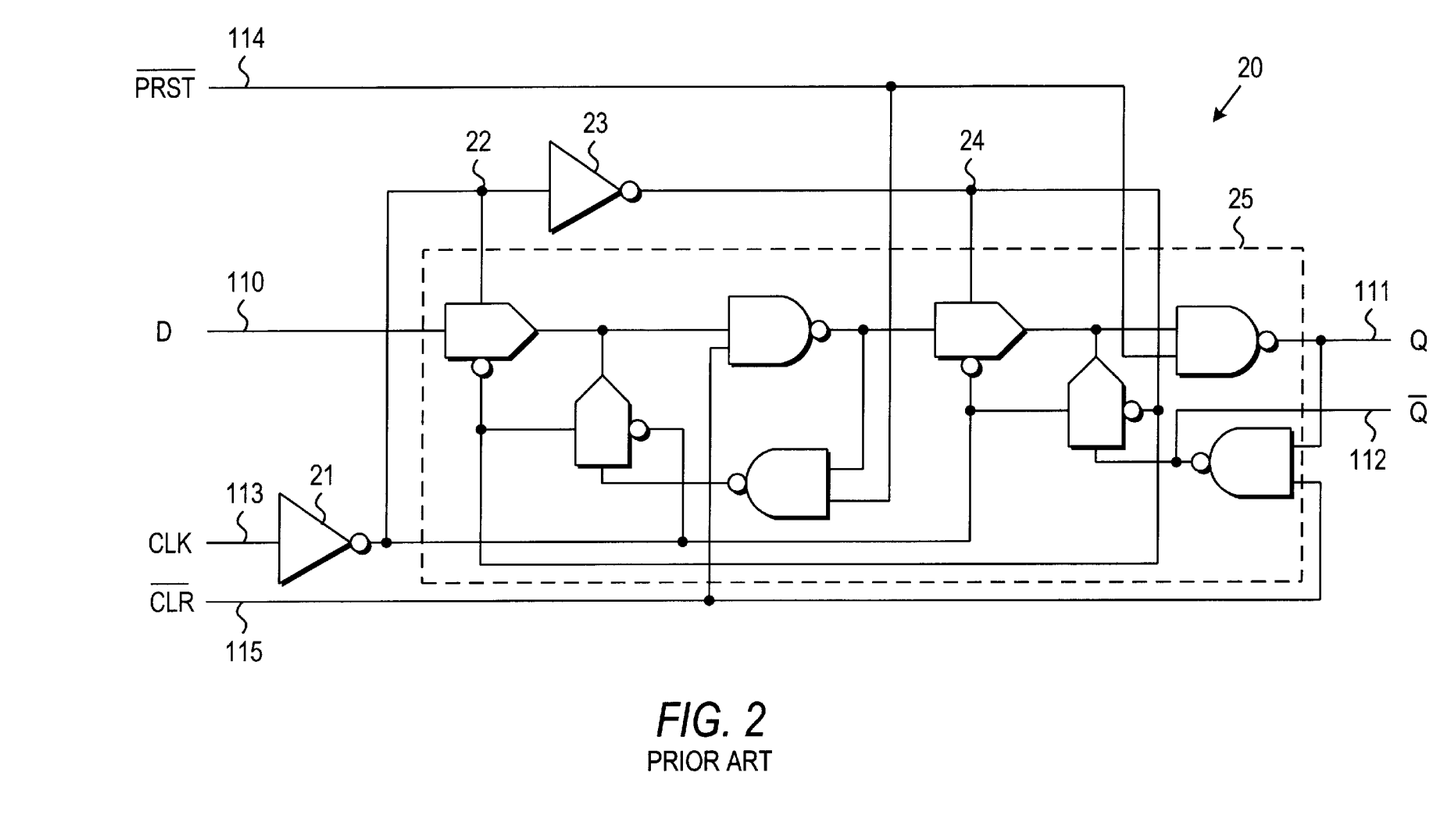
FIG. 2 is a schematic diagram of the interior of the flip-flop in the circuit of FIG. 1.

Even when latch circuit 10 is in bypass mode, clock signal 103 continues to arrive on flip-flop clock input 113, changing continuously. In addition, data arriving at input terminal 110 may continue to vary. The interior circuitry 20 of flip-flop 11 is shown in FIG. 2. As can be seen, clock input 113 passes through inverter 21 to node 22, thence through, inter alia, inverter 23 to node 24, and thence to the remainder of functional circuitry 25. Data input 110 also passes to functional circuitry 25 to generate output 111.

Figure 3:
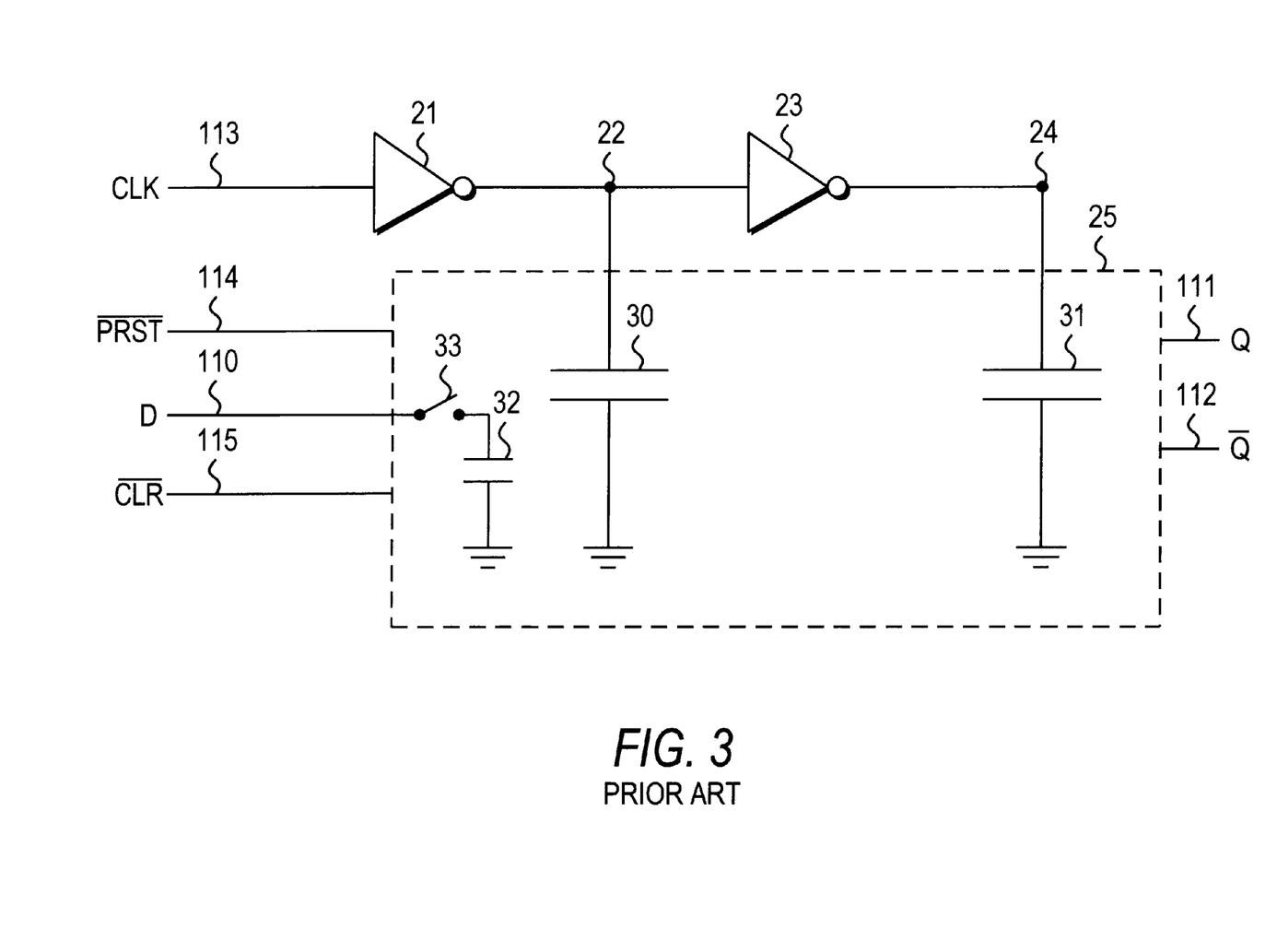
FIG. 3 is a simplified schematic diagram of the flip-flop circuitry shown in FIG. 2.

From a power consumption perspective, circuitry 20 can be modeled as shown in FIG. 3. As shown, clock input 113 passes through inverter 21 to node 22, thence through inverter 23 to node 24. Functional circuitry 25 can be considered as capacitances 30 and 31 between nodes 22, 24 and ground. Thus, in accordance with the circuit operation described above, even in bypass mode, whenever clock input 113 changes, the potentials at nodes 22, 24 change, resulting in wasteful charging and discharging of capacitances 30, 31.

Similarly, data input 110 feeds a multiplexer 250 within functional circuitry 25, which "sees" a capacitance 32 formed by multiplexer 251 and NAND gate 252. If data input 101/110 changes, even when circuit 10 is in bypass mode, there could be wasteful charging and discharging of capacitance 32 even if clock 103 were quiescent.

Figure 4:
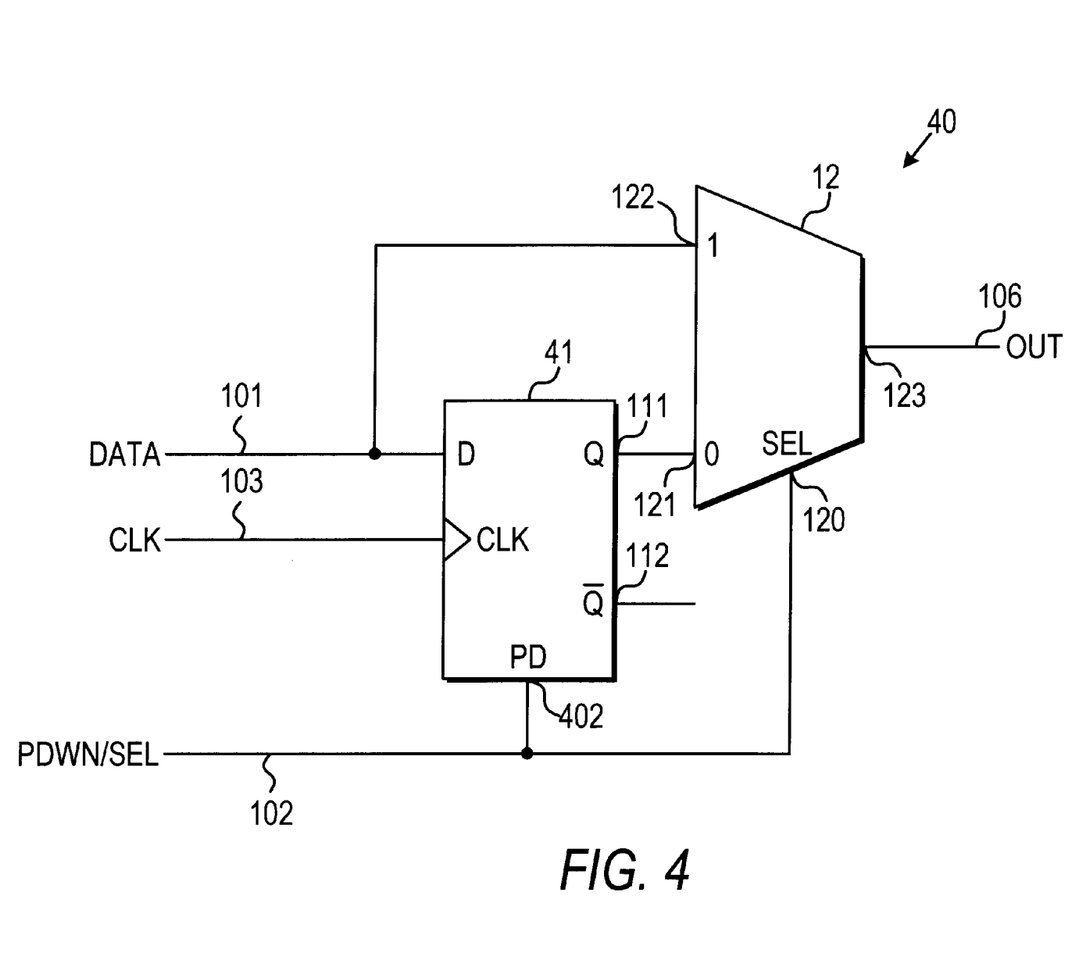
FIG. 4 is a schematic diagram of a preferred embodiment of a modified latch circuit in accordance with the present invention.
Figure 5:
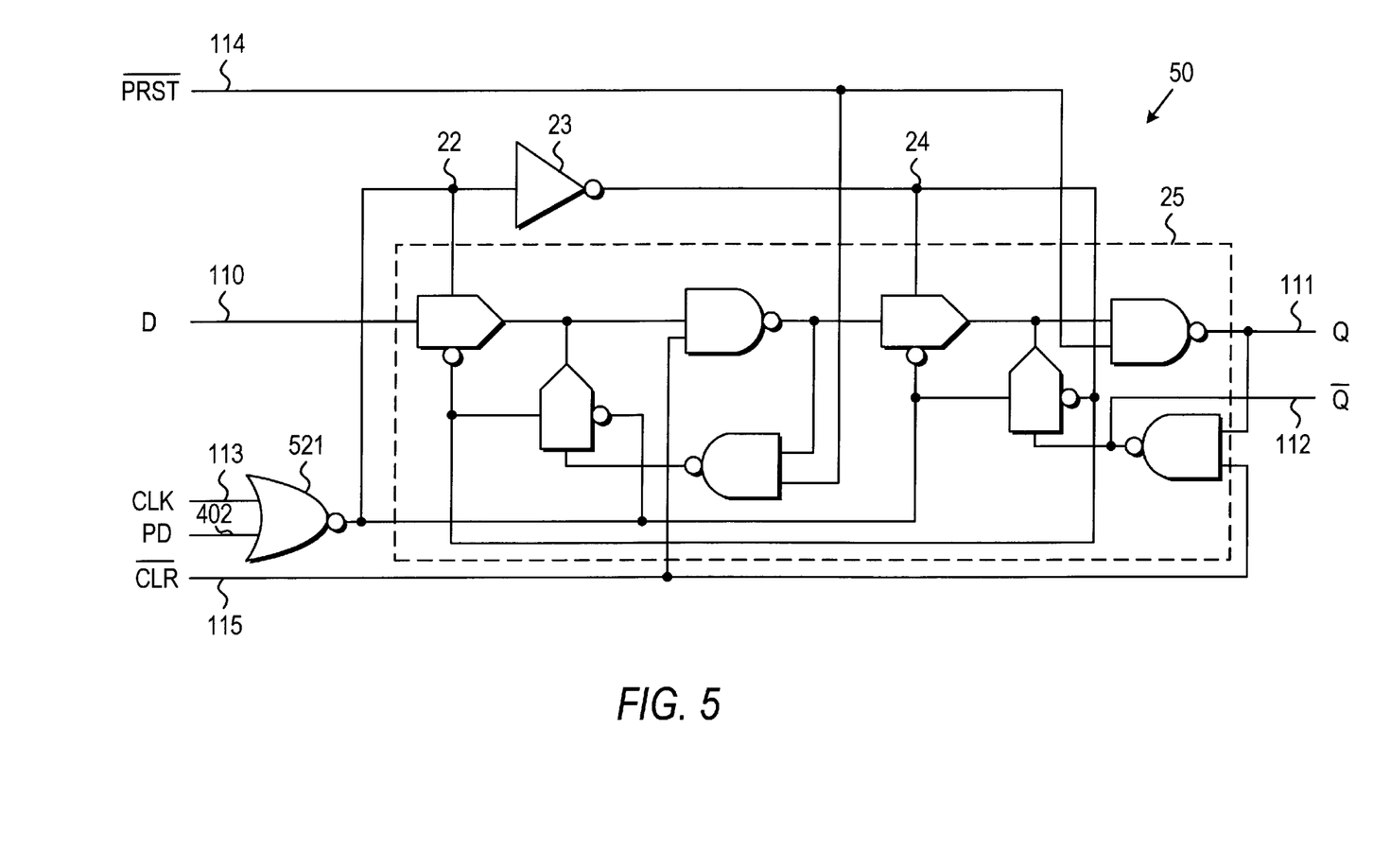
FIG. 5 is a schematic diagram of a first variant of a modified flip-flop in the modified latch circuit of FIG. 4.

Latch circuit 40 according to the present invention, shown in FIG. 4, is similar to latch circuit 10, except that control input 102 is not only selection control input 120 of multiplexer 12, but also is the power-down input 402 of a modified flip-flop 41. In a first variant 50 of modified flip-flop 41, shown in FIG. 5, inverter 21 is replaced by NOR gate 521. The inputs of NOR gate 521 are clock input 113 and power-down input 402. The truth table for NOR gate 521 is as follows:

| PD<br>CLK | 0 | 1 |
|---|---|---|
| 0 | 1 | 0 |
| 1 | 0 | 0 |

Thus, when power-down input 402 is HIGH, selecting the power-down or low-power mode, the output of NOR gate 521 is always LOW. Therefore, node 522 will remain LOW and node 524 will remain HIGH, and there will be no charging or discharging of capacitances 30, 31, reducing the power consumption of flip-flop 50. On the other hand, when power-down input 402 is LOW, selecting the normal mode, the output of NOR gate 521 is the inverse of clock input 113, which is the same as keeping inverter 21 in place of NOR gate 521, thereby replicating normal operation of flip-flop 11.

Figure 6:
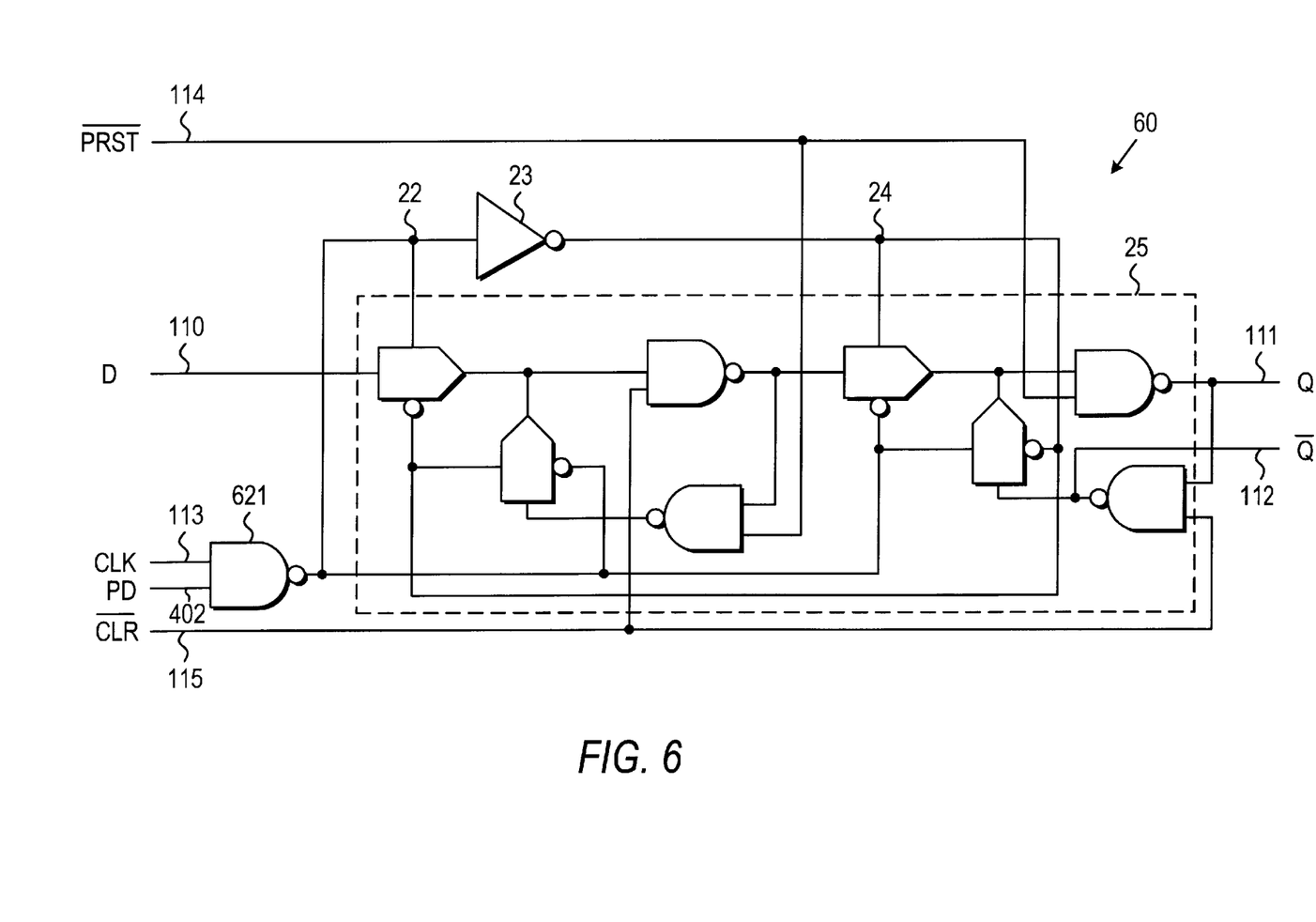
FIG. 6 is a schematic diagram of a second variant of a modified flip-flop in the modified latch circuit of FIG. 4.

In a second variant 60 of modified flip-flop 41, shown in FIG. 6, inverter 21 is replaced by NAND gate 621. The inputs of NAND gate 621 are clock input 113 and power-down input 502. The truth table for NAND gate 621 is as follows:

| PD<br>CLK | 0 | 1 |
|---|---|---|
| 0 | 1 | 1 |
| 1 | 1 | 0 |

Thus, in this case, power-down input 402 selects the power-down or low-power mode when it is LOW, in which case the output of NAND gate 621 is always HIGH. Therefore, node 622 will remain HIGH and node 624 will remain LOW, and there will be no charging or discharging of capacitances 30, 31, reducing the power consumption of flip-flop 60. On the other hand, when power-down input 402 is HIGH, selecting the normal mode, the output of NAND gate 621 is the inverse of clock input 113, which is the same as keeping inverter 21 in place of NAND gate 621, thereby replicating normal operation of flip-flop 11.

Figure 7:
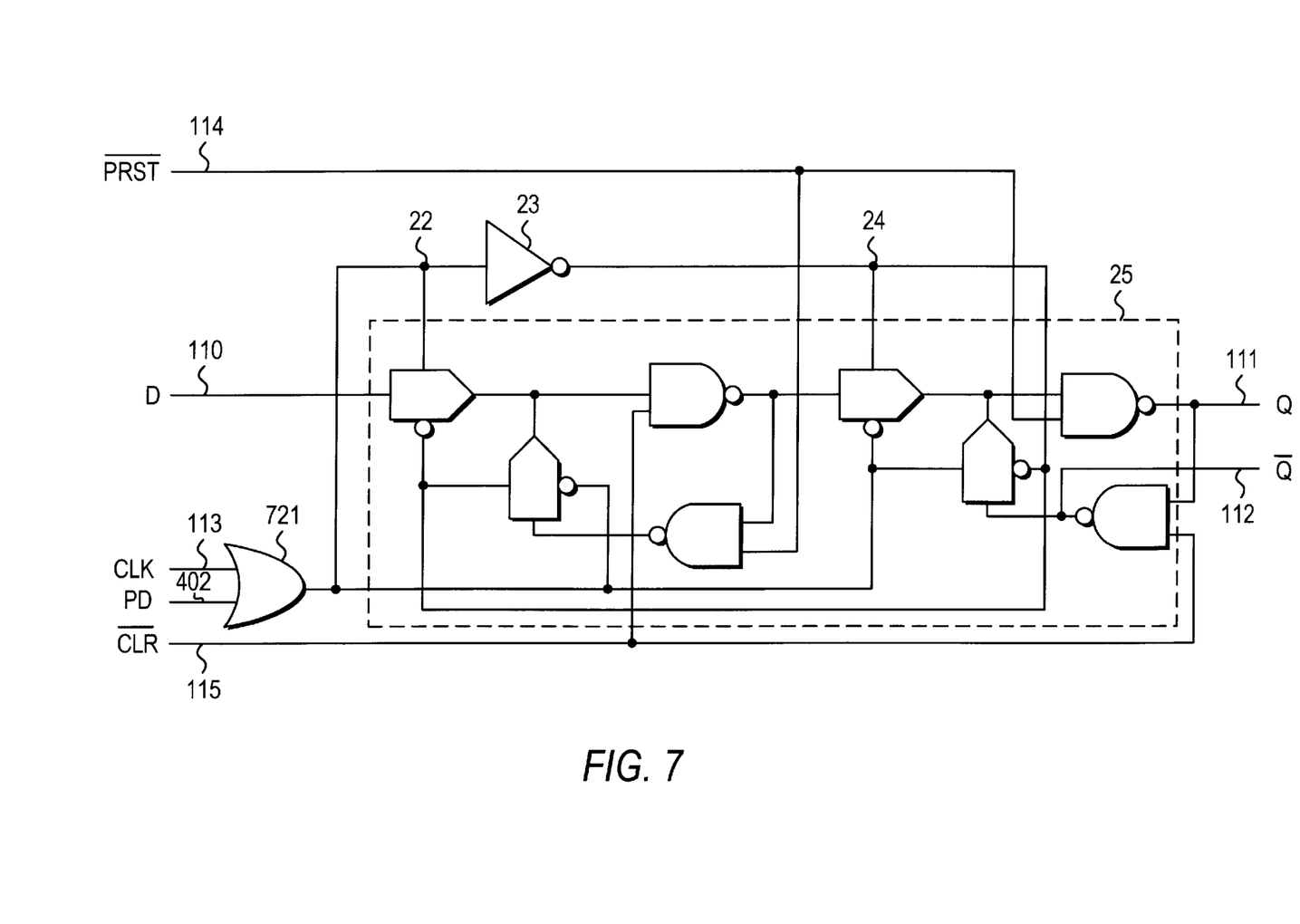
FIG. 7 is a schematic diagram of a third variant of a modified flip-flop in the modified latch circuit of FIG. 4.

In a third variant 70 of modified flip-flop 41, shown in FIG. 7, inverter 21 is replaced by OR gate 721. The inputs of OR gate 721 are clock input 113 and power-down input 402. The truth table for OR gate 521 is as follows:

| PD<br>CLK | 0 | 1 |
|---|---|---|
| 0 | 0 | 1 |
| 1 | 1 | 1 |

Thus, when power-down input 402 is HIGH, selecting the power-down or low-power mode, the output of OR gate 721 is always HIGH. Therefore, node 722 will remain HIGH and node 724 will remain LOW, and there will be no charging or discharging of capacitances 30, 31, reducing the power consumption of flip-flop 70. On the other hand, when power-down input 402 is LOW, selecting the normal mode, the output of OR gate 721 is follows clock input 113. This is the inverse of keeping inverter 21 in place of OR gate 721, and is useful for replicating normal operation of flip-flop 11 but with an inverted clock signal ($\overline{CLOCK}$).

Figure 8:
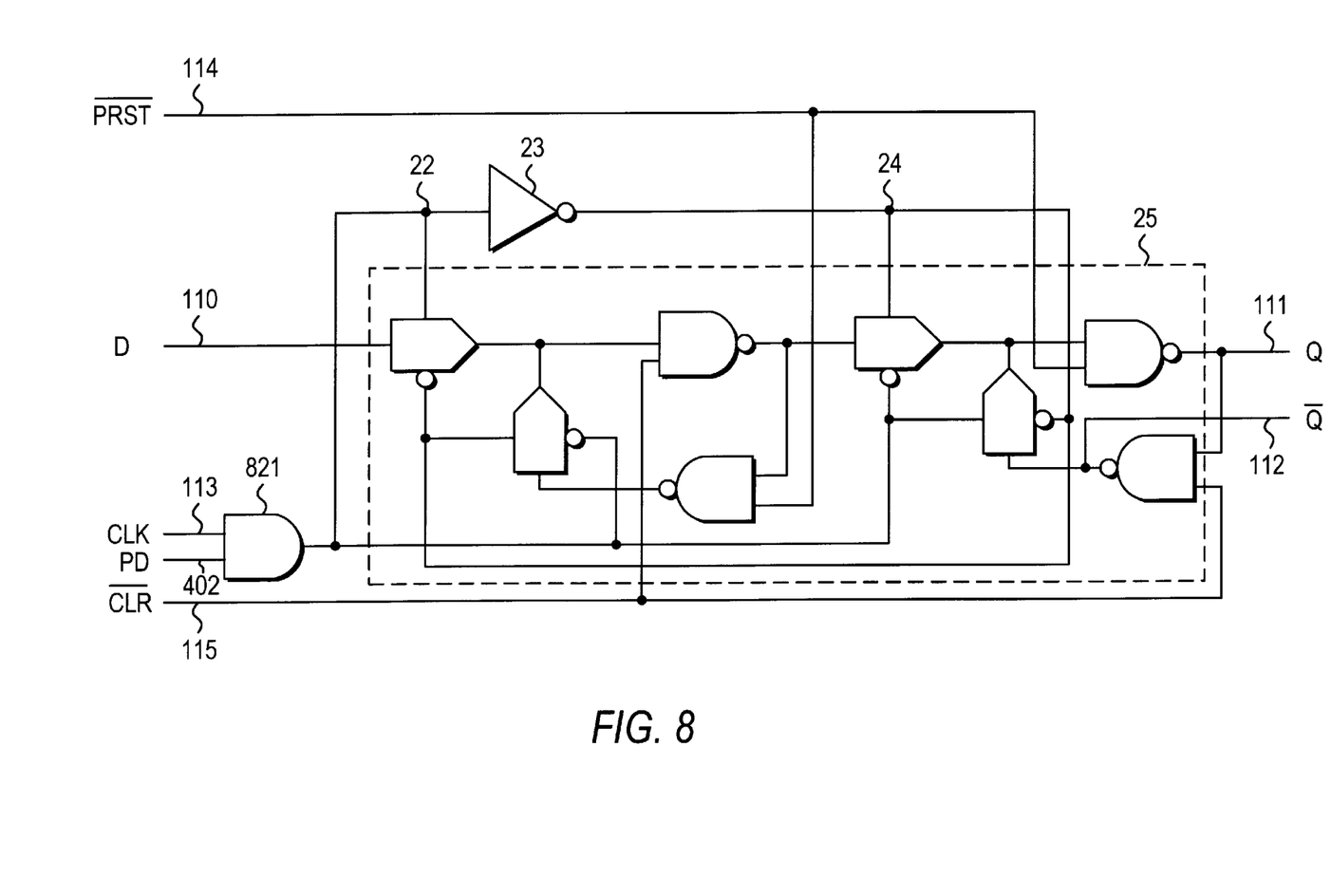
FIG. 8 is a schematic diagram of a fourth variant of a modified flip-flop in the modified latch circuit of FIG. 4.

In a fourth variant 80 of modified flip-flop 41, shown in FIG. 8, inverter 21 is replaced by AND gate 821. The inputs of AND gate 821 are clock input 113 and power-down input 402. The truth table for AND gate 821 is as follows:

| PD<br>CLK | 0 | 1 |
|---|---|---|
| 0 | 0 | 0 |
| 1 | 0 | 1 |

Thus, in this case, power-down input 402 selects the power-down or low-power mode when it is LOW, in which case the output of AND gate 821 is always LOW. Therefore, node 822 will remain LOW and node 824 will remain HIGH, and there will be no charging or discharging of capacitances 30, 31, reducing the power consumption of flip-flop 80. On the other hand, when power-down input 402 is HIGH, selecting the normal mode, the output of AND gate 821 follows clock input 113. This is the inverse of keeping inverter 21 in place of OR gate 721, and is useful for replicating normal operation of flip-flop 11 but with an inverted clock signal ($\overline{CLOCK}$).

With respect to capacitance 32, variants 50 and 80 of modified latch circuit 41 are preferred. In variants 50 and 80, when the power-down or low-power mode is selected, node 22 is low, and therefore multiplexer 250, which may be modelled as a switch 33 (FIG. 3), is turned off, so that changes in input 101/110 do not result in charging or discharging of capacitance 32.

Figure 9:
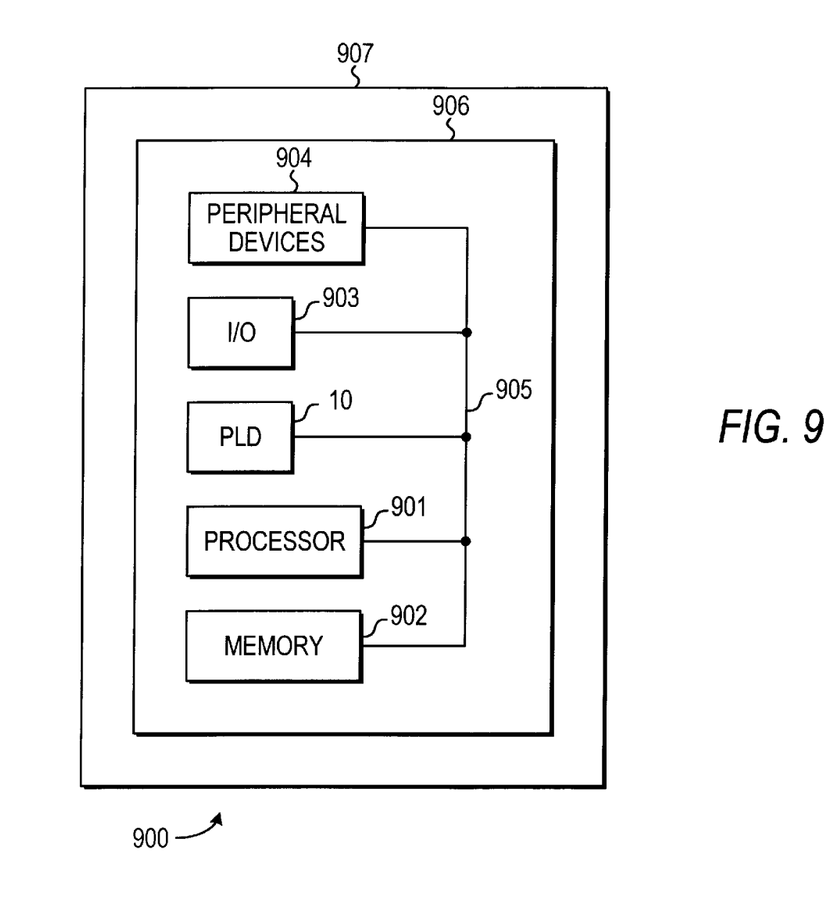
FIG. 9 is a simplified block diagram of an illustrative system employing a programmable logic device incorporating a latch circuit in accordance with the invention.

The modified latch circuit 41 of this invention may be used in a programmable logic device 10, which is shown in FIG. 9 as part of a data processing system 900. The state of selection control input/power-down input 120/402 may be controlled by the setting of a configuration bit in device 10. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 901. Programmable logic device 10 may also be used as an arbiter for arbitrating access to a shared resource in system 900. In yet another example, programmable logic device 10 can be configured as an interface between processor 901 and one of the other components in system 900. It should be noted that system 900 is only exemplary, and that the true scope and spirit of the invention should be indicated by the following claims.

Various technologies can be used to implement programmable logic devices 10 employing modified bypassable flip-flops as output latches as described above according to this invention. Moreover, this invention is applicable to both one-time-only programmable and reprogrammable devices.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A latch circuit comprising:
    a flip-flop circuit including:
        a data input,
        a data output, and
        a clock input; and
    a multiplexer including:
        a first input connected to said data input,
        a second input connected to said data output,
        a latch output, and
        a control input for selecting one of said first-and second inputs as said latch output; wherein:
            said flip-flop circuit further comprises a low-power selection input connected to said control input of said multiplexer; and
            when said control input selects said first input as said latch output, said low-power selection input causes said flip-flop circuit to enter a low-power mode.

2. The latch circuit of claim 1 wherein:
    said flip-flop circuit further comprises a controllable inverter driven by said clock input;
    when said low-power selection input is in a first state selecting said low-power mode, said controllable inverter ignores said clock input and generates a fixed inverter output; and
    when said low-power selection input is in a second state opposite said first state, said controllable inverter generates an inverter output based on said clock input.

3. The latch circuit of claim 2 wherein:
    said flip-flop circuit further comprises:
        a second inverter driven by said controllable inverter,
        a first node between said controllable inverter and said second inverter,
        a second node following said second inverter,
        a first functional block connected to said first node and having capacitance, and
        a second functional block connected to said second node and having capacitance;
        when said low-power selection input is in said first state selecting said low-power mode and said controllable inverter ignores said clock input and generates said fixed inverter output, said capacitance retains a substantially fixed charge; and
        when said low-power selection input is in said second state opposite said first state and said controllable inverter generates said inverter output based on said clock input, said capacitance is charged and discharged as said clock input varies.

4. The latch circuit of claim 2 wherein when said low-power selection input is in said second state opposite said first state, said controllable inverter inverts said clock input.

5. The latch circuit of claim 4 wherein:
    said controllable inverter is a NOR gate having said clock input as a first input thereof and said low-power selection input as a second input thereof; and
    said second state of said low-power selection input is a low state.

6. The latch circuit of claim 5 wherein:
    said flip-flop circuit further comprises:
        a multiplexer driven by said data input and controlled by output of said NOR gate, and
        a functional block driven by said multiplexer and having capacitance;
        when said low-power selection input is in said first state selecting said low-power mode, said NOR gate ignores said clock input and generates a fixed low inverter output turning off said multiplexer, and said capacitance retains a substantially fixed charge; and
        when said low-power selection input is in said second state opposite said first state, said NOR gate generates said inverter output based on said clock input, turning said multiplexer on and off, and said capacitance is charged and discharged when said multiplexer turns on and said data input varies.

7. The latch circuit of claim 4 wherein:
    said controllable inverter is a NAND gate having said clock input as a first input thereof and said low-power selection input as a second input thereof; and
    said second state of said low-power selection input is a high state.

8. The latch circuit of claim 2 wherein when said low-power selection input is in said second state opposite said first state, said controllable inverter follows said clock input.

9. The latch circuit of claim 8 wherein said controllable inverter is an OR gate having said clock input as a first input thereof and said low-power selection input as a second input thereof; and
    said second state of said low-power selection input is a low state.

10. The latch circuit of claim 8 wherein said controllable inverter is an AND gate having said clock input as a first input thereof and said low-power selection input as a second input thereof; and
    said second state of said low-power selection input is a high state.

11. The latch circuit of claim 10 wherein:
said flip-flop circuit further comprises:
  a multiplexer driven by said data input and controlled by output of said AND gate, and
  a functional block driven by said multiplexer and having capacitance;
  when said low-power selection input is in said first state selecting said low-power mode, said AND gate ignores said clock input and generates a fixed low inverter output turning off said multiplexer, and said capacitance retains a substantially fixed charge; and
  when said low-power selection input is in said second state opposite said first state, said AND gate generates said inverter output based on said clock input, turning said multiplexer on and off, and said capacitance is charged and discharged when said multiplexer turns on and said data input varies.

12. A programmable logic device comprising:
programmable logic circuitry generating a logical output; and
the latch circuit of claim 1; wherein:
  said logical output is connected to said first input.

13. The programmable logic device of claim 12 wherein:
said flip-flop circuit further comprises a controllable inverter driven by said clock input;
when said low-power selection input is in a first state selecting said low-power mode, said controllable inverter ignores said clock input and generates a fixed inverter output; and
when said low-power selection input is in a second state opposite said first state, said controllable inverter generates an inverter output based on said clock input.

14. The programmable logic device of claim 13 wherein:
said flip-flop circuit further comprises:
  a second inverter driven by said controllable inverter,
  a first node between said controllable inverter and said second inverter,
  a second node following said second inverter,
  a first functional block connected to said first node and having capacitance, and
  a second functional block connected to said second node and having capacitance;
  when said low-power selection input is in said first state selecting said low-power mode and said controllable inverter ignores said clock input and generates said fixed inverter output, said capacitance retains a substantially fixed charge; and
  when said low-power selection input is in said second state opposite said first state and said controllable inverter generates said inverter output based on said clock input, said capacitance is charged and discharged as said clock input varies.

15. The programmable logic device of claim 13 wherein when said low-power selection input is in said second state opposite said first state, said controllable inverter inverts said clock input.

16. The programmable logic device of claim 15 wherein:
said controllable inverter is a NOR gate having said clock input as a first input thereof and said low-power selection input as a second input thereof; and
said second state of said low-power selection input is a low state.

17. The programmable logic device of claim 16 wherein:
said flip-flop circuit further comprises:
  a multiplexer driven by said data input and controlled by output of said NOR gate, and
  a functional block driven by said multiplexer and having capacitance;
  when said low-power selection input is in said first state selecting said low-power mode, said NOR gate ignores said clock input and generates a fixed low inverter output turning off said multiplexer, and said capacitance retains a substantially fixed charge; and
  when said low-power selection input is in said second state opposite said first state, said NOR gate generates said inverter output based on said clock input, turning said multiplexer on and off, and said capacitance is charged and discharged when said multiplexer turns on and said data input varies.

18. The programmable logic device of claim 15 wherein:
said controllable inverter is a NAND gate having said clock input as a first input thereof and said low-power selection input as a second input thereof; and
said second state of said low-power selection input is a high state.

19. The programmable logic device of claim 13 wherein when said low-power selection input is in said second state opposite said first state, said controllable inverter follows said clock input.

20. The programmable logic device of claim 19 wherein said controllable inverter is an OR gate having said clock input as a first input thereof and said low-power selection input as a second input thereof; and
said second state of said low-power selection input is a low state.

21. The programmable logic device of claim 19 wherein said controllable inverter is an AND gate having said clock input as a first input thereof and said low-power selection input as a second input thereof; and
said second state of said low-power selection input is a high state.

22. The programmable logic device of claim 21 wherein:
said flip-flop circuit further comprises:
  a multiplexer driven by said data input and controlled by output of said AND gate, and
  a functional block driven by said multiplexer and having capacitance;
  when said low-power selection input is in said first state selecting said low-power mode, said AND gate ignores said clock input and generates a fixed low inverter output turning off said multiplexer, and said capacitance retains a substantially fixed charge; and
  when said low-power selection input is in said second state opposite said first state, said AND gate generates said inverter output based on said clock input, turning said multiplexer on and off, and said capacitance is charged and discharged when said multiplexer turns on and said data input varies.

23. A digital processing system comprising:
processing circuitry;
a memory coupled to said processing circuitry; and
a programmable logic device as defined in claim 12 coupled to the processing circuitry and the memory.

24. A printed circuit board on which is mounted a programmable logic device as defined in claim 12.

25. The printed circuit board defined in claim 24 further comprising:
memory circuitry mounted on the printed circuit board and coupled to the programmable logic device.

26. The printed circuit board defined in claim 25 further comprising:
processing circuitry mounted on the printed circuit board and coupled to the memory circuitry.

27. A latch circuit comprising:
data latching means including a data input and a latched data output;
means for bypassing said data latching means, said means for bypassing having an output selectable between said data input and said latched data output; wherein:
said data latching means switches, responsive to said means for bypassing, between (a) operation in a normal mode, and (b) operation in a low-power mode.

28. The latch circuit of claim 27 wherein:
said data latching means comprises:
said data input,
said latched data output, and
a clock input; and
said means for bypassing comprises:
a first input connected to said data input,
a second input connected to said latched data output,
a latch output, and
a control input for selecting one of said first and second inputs as said latch output; wherein:
said data latching means further comprises a low-power selection input connected to said control input of said means for bypassing; and
when said control input selects said first input as said latch output, said low-power selection input causes said data latching means to enter said low-power mode.

29. The latch circuit of claim 28 wherein:
said data latching means further comprises controllable inverter means driven by said clock input;
when said low-power selection input is in a first state selecting said low-power mode, said controllable inverter means ignores said clock input and generates a fixed inverter output; and
when said low-power selection input is in a second state opposite said first state, said controllable inverter means generates an inverter output based on said clock input.

30. The latch circuit of claim 29 wherein:
said data latching means further comprises:
controllable inverter means driven by said clock input,
second inverter means driven by said controllable inverter means,
a first node between said controllable inverter means and said second inverter means,
a second node following said second inverter means,
a first functional block connected to said first node and having capacitance, and
a second functional block connected to said second node and having capacitance;
when said low-power selection input is in said first state selecting said low-power mode and said controllable inverter means ignores said clock input and generates said fixed inverter output, said capacitance retains a substantially fixed charge; and
when said low-power selection input is in said second state opposite said first state and said controllable inverter means generates said inverter output based on said clock input, said capacitance is charged and discharged as said clock input varies.

31. The latch circuit of claim 29 wherein when said low-power selection input is in said second state opposite said first state, said controllable inverter means inverts said clock input.

32. The latch circuit of claim 31 wherein:
said controllable inverter means is a NOR gate having said clock input as a first input thereof and said low-power selection input as a second input thereof; and
said second state of said low-power selection input is a low state.

33. The latch circuit of claim 32 wherein:
said data latching means further comprises:
a multiplexer driven by said data input and controlled by output of said NOR gate, and
a functional block driven by said multiplexer and having capacitance;
when said low-power selection input is in said first state selecting said low-power mode, said NOR gate ignores said clock input and generates a fixed low inverter output turning off said multiplexer, and said capacitance retains a substantially fixed charge; and
when said low-power selection input is in said second state opposite said first state, said NOR gate generates said inverter output based on said clock input, turning said multiplexer on and off, and said capacitance is charged and discharged when said multiplexer turns on and said data input varies.

34. The latch circuit of claim 31 wherein:
said controllable inverter means is a NAND gate having said clock input as a first input thereof and said low-power selection input as a second input thereof; and
said second state of said low-power selection input is a high state.

35. The latch circuit of claim 29 wherein when said low-power selection input is in said second state opposite said first state, said controllable inverter means follows said clock input.

36. The latch circuit of claim 35 wherein said controllable inverter means is an OR gate having said clock input as a first input thereof and said low-power selection input as a second input thereof; and
said second state of said low-power selection input is a low state.

37. The latch circuit of claim 35 wherein said controllable inverter means is an AND gate having said clock input as a first input thereof and said low-power selection input as a second input thereof; and
said second state of said low-power selection input is a high state.

38. The latch circuit of claim 37 wherein:
said data latching means further comprises:
a multiplexer driven by said data input and controlled by output of said AND gate, and
a functional block driven by said multiplexer and having capacitance;
when said low-power selection input is in said first state selecting said low-power mode, said AND gate ignores said clock input and generates a fixed low inverter output turning off said multiplexer, and said capacitance retains a substantially fixed charge; and
when said low-power selection input is in said second state opposite said first state, said AND gate generates said inverter output based on said clock input, turning said multiplexer on and off, and said capacitance is charged and discharged when said multiplexer turns on and said data input varies.

39. A programmable logic device comprising:

programmable logic circuitry generating a logical output; and the latch circuit of claim 28; wherein:

said logical output is connected to said first input.

40. The programmable logic device of claim 39 wherein:

said data latching means further comprises controllable inverter means driven by said clock input;

when said low-power selection input is in a first state selecting said low-power mode, said controllable inverter ignores said clock input and generates a fixed inverter output; and when said low-power selection input is in a second state opposite said first state, said controllable inverter generates an inverter output based on said clock input.

41. The programmable logic device of claim 40 wherein:

said data latching means further comprises:
  second inverter means driven by said controllable inverter means,
  a first node between said controllable inverter means and said second inverter means,
  a second node following said second inverter means,
  a first functional block connected to said first node and having capacitance, and
  a second functional block connected to said second node and having capacitance;
  when said low-power selection input is in said first state selecting said low-power mode and said controllable inverter ignores said clock input and generates said fixed inverter output, said capacitance retains a substantially fixed charge; and
  when said low-power selection input is in said second state opposite said first state and said controllable inverter generates said inverter output based on said clock input, said capacitance is charged and discharged as said clock input varies.

42. The programmable logic device of claim 40 wherein when said low-power selection input is in said second state opposite said first state, said controllable inverter means inverts said clock input.

43. The programmable logic device of claim 42 wherein:

said controllable inverter means is a NOR gate having said clock input as a first input thereof and said low-power selection input as a second input thereof; and said second state of said low-power selection input is a low state.

44. The programmable logic device of claim 43 wherein:

said data latching means further comprises:
  a multiplexer driven by said data input and controlled by output of said NOR gate, and
  a functional block driven by said multiplexer and having capacitance;
  when said low-power selection input is in said first state selecting said low-power mode, said NOR gate ignores said clock input and generates a fixed low inverter output turning off said multiplexer, and said capacitance retains a substantially fixed charge; and
  when said low-power selection input is in said second state opposite said first state, said NOR gate generates said inverter output based on said clock input, turning said multiplexer on and off, and said capacitance is charged and discharged when said multiplexer turns on and said data input varies.

45. The programmable logic device of claim 42 wherein:

said controllable inverter means is a NAND gate having said clock input as a first input thereof and said low-power selection input as a second input thereof; and said second state of said low-power selection input is a high state.

46. The programmable logic device of claim 40 wherein when said low-power selection input is in said second state opposite said first state, said controllable inverter means follows said clock input.

47. The programmable logic device of claim 46 wherein said controllable inverter means is an OR gate having said clock input as a first input thereof and said low-power selection input as a second input thereof; and said second state of said low-power selection input is a low state.

48. The programmable logic device of claim 46 wherein said controllable inverter means is an AND gate having said clock input as a first input thereof and said low-power selection input as a second input thereof; and said second state of said low-power selection input is a high state.

49. The programmable logic device of claim 48 wherein:

said data latching means further comprises:
  a multiplexer driven by said data input and controlled by output of said AND gate, and
  a functional block driven by said multiplexer and having capacitance;
  when said low-power selection input is in said first state selecting said low-power mode, said AND gate ignores said clock input and generates a fixed low inverter output turning off said multiplexer, and said capacitance retains a substantially fixed charge; and
  when said low-power selection input is in said second state opposite said first state, said AND gate generates said inverter output based on said clock input, turning said multiplexer on and off, and said capacitance is charged and discharged when said multiplexer turns on and said data input varies.

50. A digital processing system comprising:

processing circuitry;

a memory coupled to said processing circuitry; and a programmable logic device as defined in claim 39 coupled to the processing circuitry and the memory.

51. A printed circuit board on which is mounted a programmable logic device as defined in claim 39.

52. The printed circuit board defined in claim 51 further comprising:

memory circuitry mounted on the printed circuit board and coupled to the programmable logic device.

53. The printed circuit board defined in claim 52 further comprising:

processing circuitry mounted on the printed circuit board and coupled to the memory circuitry.

* * * * *